United States Patent
Toshima et al.

(10) Patent No.: US 10,189,230 B2
(45) Date of Patent: Jan. 29, 2019

(54) METHOD FOR FORMING COPPER FILM

(71) Applicant: TOKYO ELECTRON LIMITED, Tokyo (JP)

(72) Inventors: Hiroyuki Toshima, Yamanashi (JP); Atsushi Shimada, Yamanashi (JP); Tatsuo Hirasawa, Yamanashi (JP); Tatsuo Hatano, Yamanashi (JP); Shinji Furukawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/638,099

(22) Filed: Jun. 29, 2017

(65) Prior Publication Data
US 2018/0001597 A1   Jan. 4, 2018

(30) Foreign Application Priority Data
Jun. 29, 2016  (JP) .................. 2016-128799

(51) Int. Cl.
*B32B 15/20*  (2006.01)
*H01L 23/532*  (2006.01)
*C01G 23/00*  (2006.01)
*C01G 41/00*  (2006.01)
*H01L 21/768*  (2006.01)

(52) U.S. Cl.
CPC ............ *B32B 15/20* (2013.01); *H01L 21/768* (2013.01); *H01L 23/53238* (2013.01); *C01G 23/00* (2013.01); *C01G 41/00* (2013.01)

(58) Field of Classification Search
CPC .......... B32B 15/20; C01G 23/00; C01G 51/00
See application file for complete search history.

(56) References Cited

U.S. PATENT DOCUMENTS 6,210,541 B1   4/2001   Cooney, III et al.
9,728,414 B2 *  8/2017   Yu ..................... H01L 21/2855

FOREIGN PATENT DOCUMENTS

JP   H11-343570       12/1999
KR   1996-0016833 B1  12/1996
KR   10-0576363 B1     5/2006

* cited by examiner

*Primary Examiner* — Seahvosh Nikmanesh

(57) ABSTRACT

A method for forming a copper film is provided. In the method, a base film that is a titanium nitride film, a tungsten film or a tungsten nitride film is formed along a surface of an insulating film of an object. A copper film is formed on the base film of the object cooled to a temperature of 209 K or less.

5 Claims, 10 Drawing Sheets

METHOD FOR FORMING COPPER FILM

CROSS-REFERENCE TO RELATED APPLICATIONS

This application claims priority to Japanese Patent Application No. 2016-128799 filed on Jun. 29, 2016, the entire contents of which are incorporated herein by reference.

FIELD OF THE INVENTION

The disclosure relates to a method for forming a copper film.

BACKGROUND OF THE INVENTION

In a semiconductor device manufacturing process, wiring processing is performed. A damascene method is known as one of the wiring process techniques. In the damascene method, a barrier film is formed on a surface of an insulating film where a recess is formed. The barrier film is generally made of tantalum, tantalum nitride, cobalt or ruthenium. Then, a copper film is formed on the barrier film. The copper film is formed by, e.g., a sputtering method.

In Japanese Patent Application Publication No. H11-343570, there is disclosed a method for forming a copper film by sputtering, wherein a temperature of a target object having an insulating film is set to a low level of 20° C. or less. In the method disclosed in Japanese Patent Application Publication No. H11-343570, by performing the sputtering of copper in a state where the temperature of the target object is set to a low level, agglomeration of copper is suppressed and a copper film has a flat surface.

A wiring made of copper requires low resistance. However, when a crystal in the copper film has a small particle size, the resistance of the wiring made of copper is increased. Therefore, it is required to form a copper film having low resistance.

SUMMARY OF THE INVENTION

In view of the above, the disclosure provides a method for forming a copper film having low resistance.

In accordance with one aspect, there is provided a method for forming a copper film is provided. In the method, a base film that is a titanium nitride film, a tungsten film or a tungsten nitride film is formed along a surface of an insulating film of an object and a copper film is formed on the base film of the object cooled to a temperature of 209 K or less.

The object having a general barrier film made of tantalum, tantalum nitride, cobalt or ruthenium is cooled to a low temperature and the copper film is formed on the barrier film. Even if the temperature of the copper film is increased, the particle size of the crystal in the copper film is not increased. In the method according to one aspect, the object having the base film that is a titanium nitride film, a tungsten film or a tungsten nitride film is cooled to a low temperature and the copper film is formed on the base film. When the temperature of the copper film formed on the base film is increased, the particle size of the crystal in the copper film is increased. Therefore, in accordance with the method according to one aspect, the copper film having low resistance is formed. In one embodiment, the temperature increase operation for increasing the particle size of the crystal in the copper film may be performed by placing the object having the copper film under a normal temperature (e.g., room temperature) environment.

A film thickness of the base film may be set such that the base film becomes in an amorphous state. The film thickness of the base film may be set to be greater than or equal to 1.0 nm and smaller than or equal to 2.5 nm.

In one embodiment, recess may be formed in the insulating film and the base film may be formed along a surface of the insulating film defining the recess. In another embodiment, the base film and the copper film may be formed on a relatively flat surface of the insulating film. The wiring may be formed by applying plasma etching to the copper film.

As described above, it is possible to form the copper film having low resistance.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
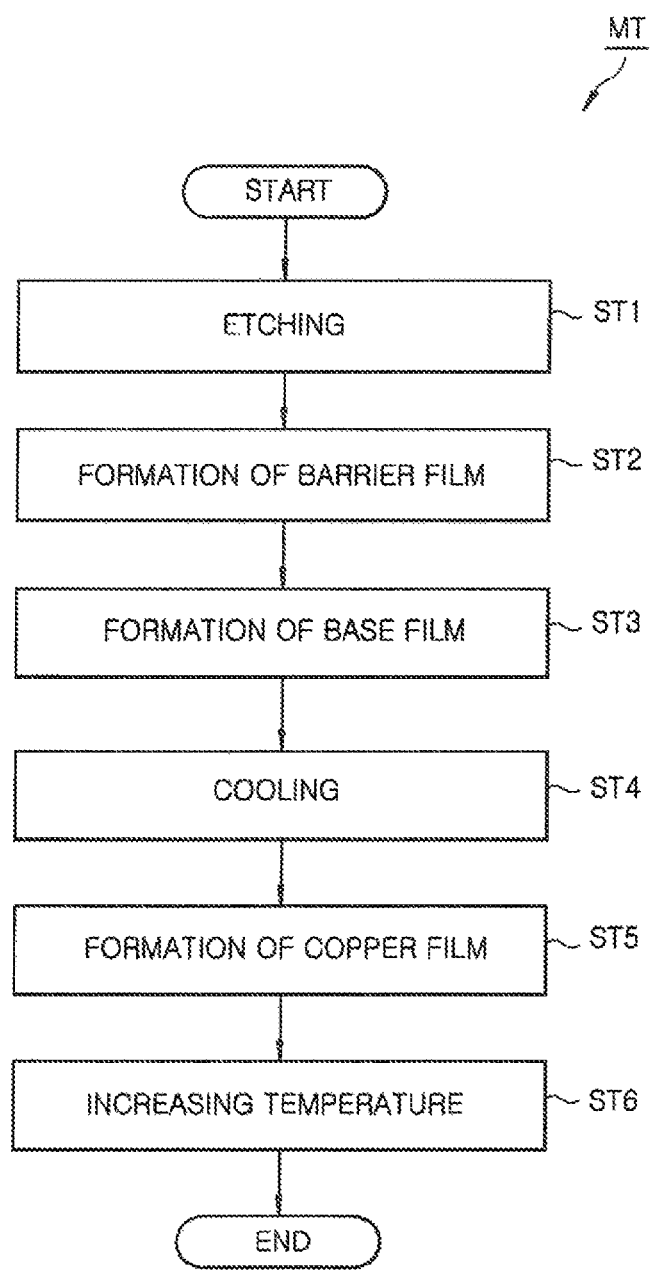
FIG. 1 is a flowchart showing a method for forming a copper film according to an embodiment.

Hereinafter, various embodiments will be described in detail with reference to the accompanying drawings. Like reference numerals will be used for like or corresponding parts throughout the respective drawings.

FIG. 1 is a flowchart showing a method for forming a copper film according to an embodiment. A method MT shown in FIG. 1 is a method for forming a copper film on a surface of an insulating film of an object. The method MT includes steps ST1 to ST6. The steps ST1 to ST6 will be described in detail later.

Figure 2:
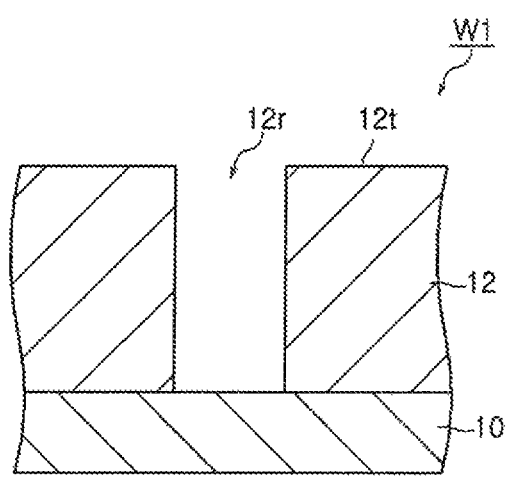
FIG. 2 is an enlarged cross sectional view showing an example of an object to which the method shown in FIG. 1 can be applied.

FIG. 2 is an enlarged cross sectional view showing an example of an object to which the method shown in FIG. 1 can be applied. An object W1 shown in FIG. 2 has a disc shape, for example. The object W1 has a base layer 10 and an insulating film 12. The insulating film 12 is formed on the base layer 10. The insulating film 12 is made of, e.g., silicon oxide. The insulating film 12 may be made of a low dielectric material (Low-K material).

A recess 12r is formed on the insulating film 12. The recess 12r extends from a top surface 12t of the insulating film 12 along a film thickness direction of the insulating film 12. The recess 12r may be, e.g., a groove or a hole. The recess 12r is formed by, e.g., photolithography and etching.

Figure 3:
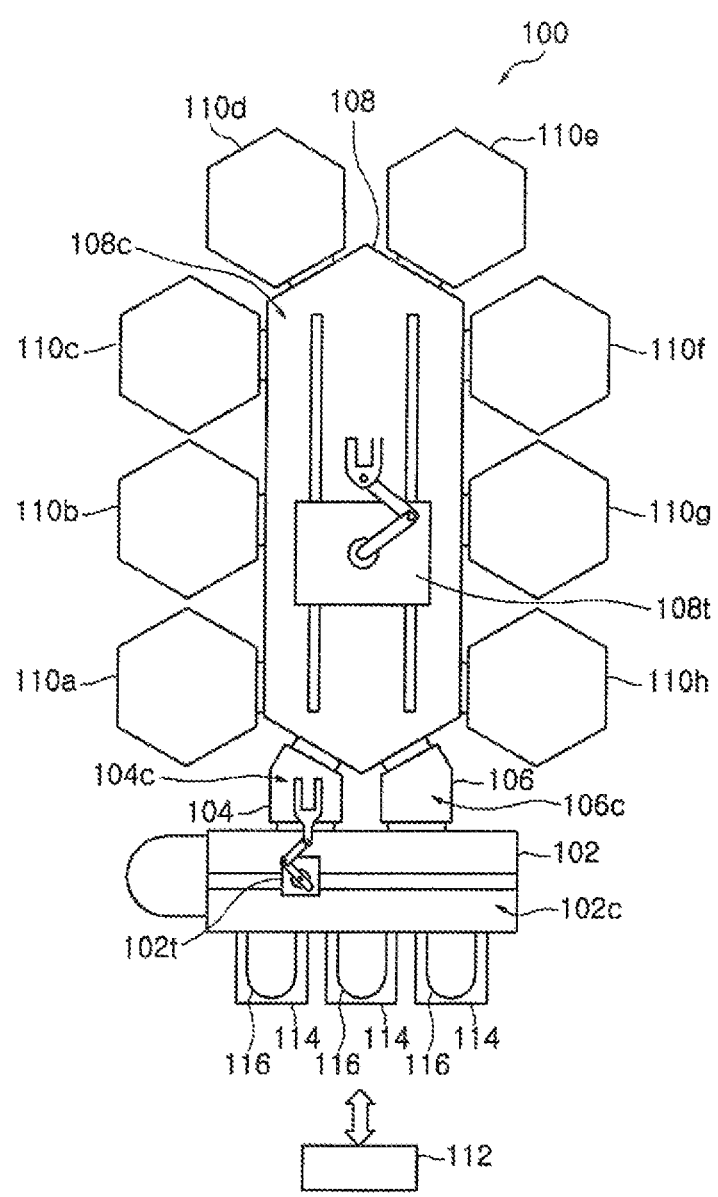
FIG. 3 shows a processing system that can be used for implementing the method shown in FIG. 1.

Hereinafter, a processing system that can be used for implementing the method MT will be described prior to a detailed description of the method MT. FIG. 3 shows a processing system that can be used for implementing the method shown in FIG. 1. A processing system 100 shown in FIG. 3 includes a loader module 102, load-lock modules 104 and 106, a transfer module 108, a plurality of processing modules 110a to 110h and a control unit 112. The number of the processing modules of the processing system 100 is eight in the example shown in FIG. 3 but not limited thereto.

The loader module 102 is configured to transfer a target object under an atmospheric pressure environment. A plurality of tables 114 is attached to the loader module 102. A container 116 capable of accommodating a plurality of target objects is mounted on each of the tables 114. The container 116 may be, e.g., a FOUP (Front-Opening Unified Pod).

The loader module 102 provides a chamber 102c. A transfer unit 102t is provided in the chamber 102c. The transfer unit 102t may include a robot arm for transferring the target objet while holding the target object. The loader module 102 is connected to the load-lock modules 104 and 106. The transfer unit 102t transfers the target object between the container 116 and the load-lock module 104 or between the container 116 and the load-lock module 106.

The load-lock modules 104 and 106 provide chambers 104c and 106c for preliminary evacuation, respectively. The transfer module 108 is connected to the load-lock modules 104 and 106. The transfer module 108 provides an evacuable transfer chamber 108c. A transfer unit 108t is provided in the transfer chamber 108c. The transfer unit 108t may include a robot arm for transferring a target object while holding the target object. The transfer module 108 is connected to a plurality of processing modules 110a to 110h. The transfer unit 108t of the transfer module 108 transfers the target object between one of the load-lock modules 104 and 106 and one of the processing modules 110a to 110h and between any two of the processing modules 110a to 110h.

The processing modules 110a to 110h include processing modules for executing a plurality of steps of the method MT. In one example, the processing module 110a is a plasma etching apparatus for performing etching in a step ST1 to be described later. The processing module 110a is, e.g., a capacitively coupled plasma etching apparatus. Further, the processing module 110a may be an inductively coupled plasma etching apparatus or a plasma etching apparatus for exciting a gas by a surface wave such as a microwave.

In one example, the processing module 110b is a film forming apparatus used for forming a barrier film in a step ST2. The processing module 110b is, e.g., a sputtering apparatus. In one example, the processing module 110c is a film forming apparatus used for forming a base film in a step ST3. The processing module 110c is, e.g., a sputtering apparatus. In one example, the processing module 110d is a processing apparatus used for cooling a target object in a step ST4. In one example, the processing module 110e is a film forming apparatus used for forming a copper film in a step ST5. The processing module 110e is, e.g., a sputtering apparatus. The film formation in two or more steps among the steps ST2, ST3 and ST5 may be performed by a film forming apparatus that is a single processing module. The steps ST4 and ST5 may be performed by the same processing module.

A control unit 112 is configured to control the loader module 102, the transfer module 108 and the processing modules 110a to 110h. The control unit 112 may be a computer having a storage device, e.g., a processor and a memory. In the storage device, a program for controlling the respective components of the processing system 100 and a recipe data for implementing the method MT in the processing system 100 are stored. The processor operates in accordance with the program and the recipe data stored in the storage device and outputs control signals for controlling the respective components of the processing system 100 to the respective components.

Figure 4A:
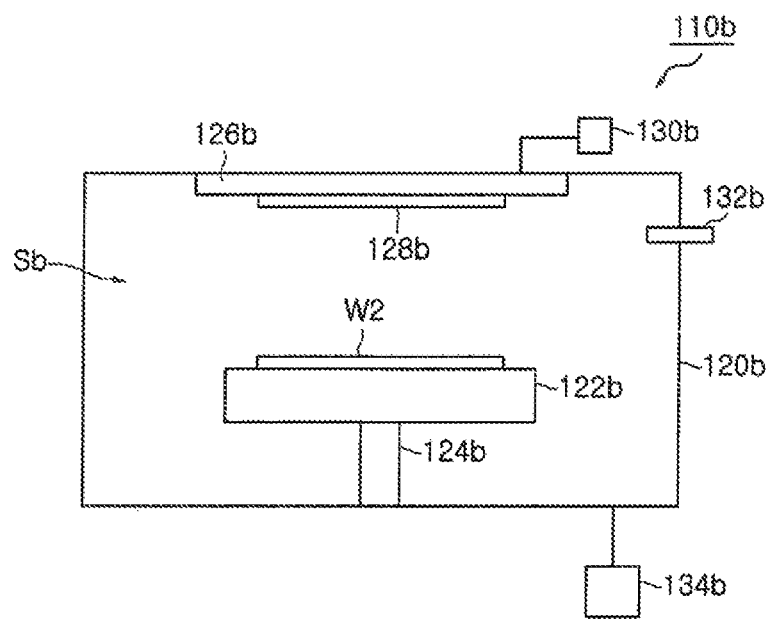
FIG. 4A schematically shows an example of a processing module used for executing a step ST2 of the method shown in FIG. 1
Figure 4B:
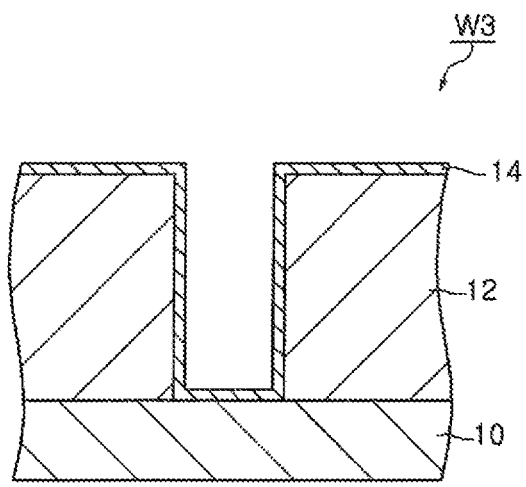
FIG. 4B is an enlarged cross sectional view showing an object after the execution of the step ST2.
Figure 5A:
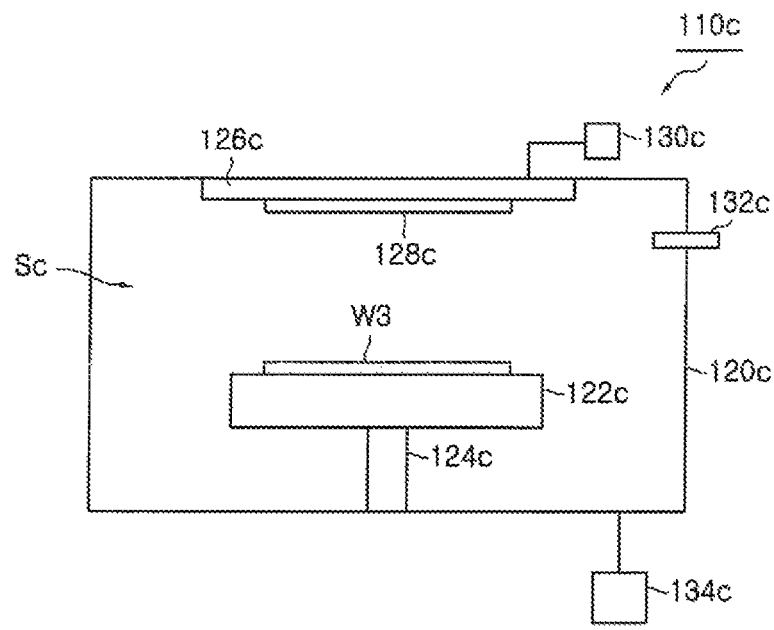
FIG. 5A schematically shows an example of a processing module used for executing a step ST3 of the method shown in FIG. 1
Figure 5B:
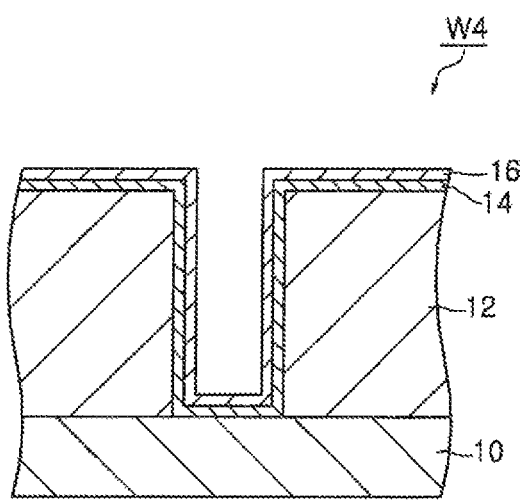
FIG. 5B is an enlarged cross sectional view showing an object after the execution of the step ST3.
Figure 6:
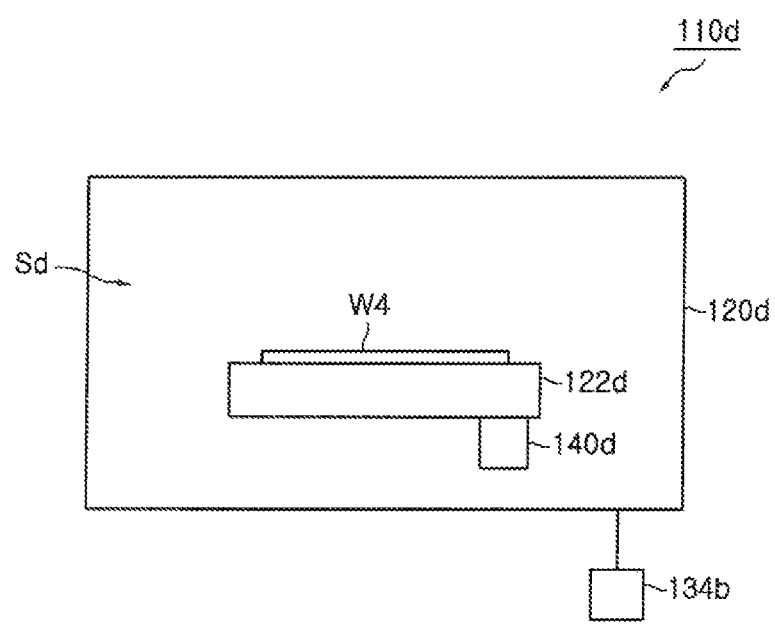
FIG. 6 schematically shows an example of a processing module used for executing a step ST4 of the method shown in FIG. 1.
Figure 7A:
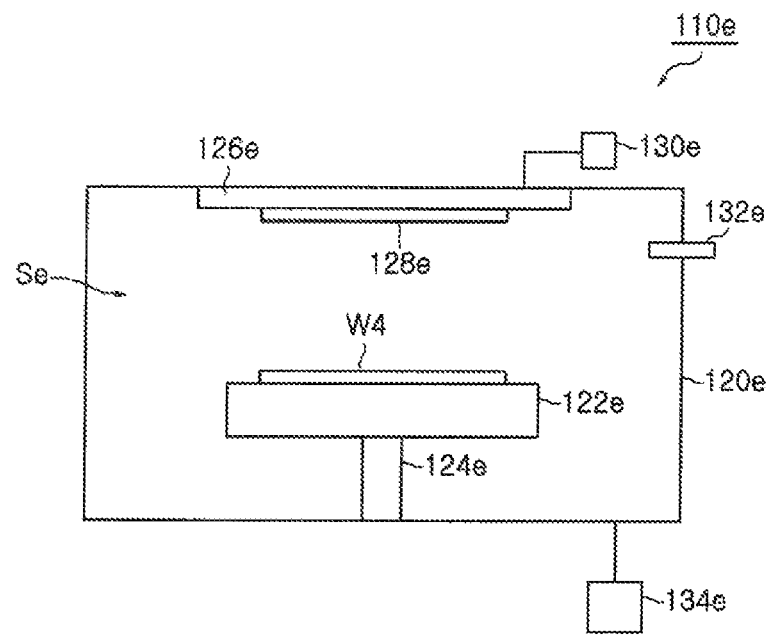
FIG. 7A schematically shows an example of a processing module used for executing a step ST5 of the method shown in FIG. 1
Figure 7B:
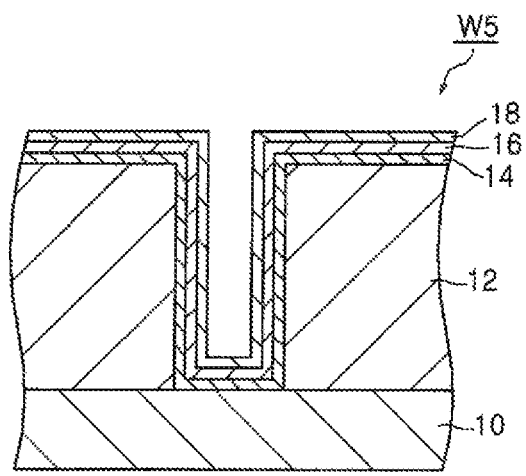
FIG. 7B is an enlarged cross sectional view showing an object after the execution of the step ST5.

Referring back to FIG. 1, the method MT will be described in detail. Hereinafter, the method MT will be described based on the case of using the processing system 100 as an example. However, the method MT may be performed by using another processing system different from the processing system 100. In the following description, FIGS. 1, 4A and 4B, 5A and 5B, 6, 7A and 7B will be referred to. FIG. 4A schematically shows an example of a processing module used for executing the step ST2 of the method shown in FIG. 1. FIG. 4B is an enlarged cross sectional view showing a target object after the execution of the step ST2. FIG. 5A schematically shows an example of a processing module used for executing the step ST3 of the method shown in FIG. 1. FIG. 5B is an enlarged cross sectional view showing a target object after the execution of the step ST3. FIG. 6 schematically shows an example of a processing module used for executing the step ST4 of the method shown in FIG. 1. FIG. 7A schematically shows an example of a processing module used for executing the step ST5 of the method shown in FIG. 1. FIG. 7B is an enlarged cross sectional view showing a target object after the execution of the step ST5.

As shown in FIG. 1, first, the step ST1 of the method MT is executed. In the step ST1, the target object W1 is etched. In the step ST1 of one embodiment, the target object W1 is mounted on a mounting table provided in a chamber of the processing module 110a. In the chamber of the processing module 110a, plasma of a rare gas such as Ar gas or the like is generated. A bias high frequency power is supplied to a lower electrode of the mounting table. In the step ST1, ions generated in the chamber are attracted to the target object W1. In the step ST1, sputter etching is performed on the target object W1, thereby slightly etching a surface of the target object W1. As a result of the step ST1, a target object W2 is obtained from the target object W1.

Next, the step ST2 of the method MT is executed. In the step ST2, a barrier film is formed on a surface of the target object W2. The surface on which the barrier film is formed includes a surface of the insulating film 12 which defines the recess 12r. The barrier film is made of tantalum, tantalum nitride, cobalt or ruthenium. In one embodiment, after the execution of the step ST1, the target object W2 is transferred from the processing module 110a to the processing module 110b through the transfer module 108. In the processing module 110b, the barrier film formation in the step ST2 is performed.

As shown in FIG. 4A, the processing module 110b is a sputtering apparatus. The processing module 110b includes a chamber main body 120b, a stage 122b, a target holder 126b, a power supply 130b, a gas supply unit 132b and a gas exhaust unit 134b. The chamber main body 120b provides an inner space as a chamber Sb. The stage 122b is provided in the chamber Sb. The stage 122b is configured to hold a target object mounted thereon. For example, the stage 122b may include an electrostatic chuck. The stage 122b is supported by a rotational shaft 124b. By rotating the rotational shaft 124b by a driving unit, the stage 122b can rotate about a central axis thereof.

A target holder 126b is provided above the stage 122b. The target holder 126b holds the target 128b. The target 128b is made of a material forming the barrier film. The target holder 126b is connected to the power supply 130b. The power supply 130b may be a DC power supply or a high frequency power supply.

In the processing module 110b, a gas is supplied from a gas supply unit 132b into the chamber Sb. The gas supplied from the gas supply unit 132b is a rare gas such as Ar gas or the like, or an inert gas. Further, in the processing module 110b, the gas exhaust unit 134b is connected to the chamber main body 120b. The gas exhaust unit 134b is a device for evacuating the chamber Sb and may include a pressure control valve and a vacuum pump such as a turbo molecular pump or the like.

In the step ST2 of an embodiment, the object W2 mounted on the stage 122b is held on the stage 122b and the stage 122b is rotated. The gas is supplied from the gas supply unit 132b into the chamber Sb. The chamber Sb is evacuated by the gas exhaust unit 134b. A voltage is applied from the power supply 130b to the target holder 126b. Accordingly, plasma is generated around the target 128b and ions in the plasma are attracted to the target 128b. When ions collide with the target 128b, a material forming the target 128b is sputtered from the target 128b. The sputtered material is deposited on the object W2. Accordingly, the barrier film 14 is formed on a surface of the object W2. As a consequence, an object W3 is obtained. As shown in FIG. 4B, the target object W3 includes a base layer 10, an insulating film 12 and a barrier film 14. The barrier film 14 is made of tantalum, tantalum nitride, cobalt or ruthenium.

Next, the step ST3 of the method MT is executed. In the step ST3, a base film is formed on a surface of the barrier film 14 of the object W3. In other words, the base film is formed along the surface of the insulating film 12 of the object W3. The base film is a titanium nitride film, a tungsten film or a tungsten nitride film. In one embodiment, after the execution of the step ST2, the object W3 is transferred from the processing module 110b to the processing module 110c through the transfer module 108. In the processing module 110c, the base film formation in the step ST3 is performed.

As shown in FIG. 5A, the processing module 110c is the same sputtering apparatus as that constituting the processing module 110b. The processing module 110c includes a chamber main body 120c, a stage 122c, a target holder 126c, a power supply 130c, a gas supply unit 132c and a gas exhaust unit 134c. The chamber main body 120c provides a chamber Sc. The stage 122c is provided in the chamber Sc. The stage 122c is supported by a rotational shaft 124c. The stage 122c rotates about a central axis thereof by the rotation of the rotation 124c by a driving unit. The target holder 126c holds the target 128c above the stage 122c. The target 128c is made of a material forming the base film. The configurations of the power supply 130c, the gas supply unit 132c and the gas exhaust unit 134c are the same as those of the power supply 130b, the gas supply unit 132b and the gas exhaust unit 134b, respectively.

In the step ST3 of one embodiment, the object W3 mounted on the stage 122c is held on the stage 122c and the stage 122c is rotated. A gas (rare gas such as Ar gas or the like or another inert gas) is supplied from the gas supply unit 132c into the chamber Sc. The chamber Sc is evacuated by the gas exhaust unit 134c. A voltage is applied from the power supply 130c to the target holder 126c. Accordingly, plasma is generated around the target 128c and ions in the plasma are attracted to the target 128c. When the ions collide with the target 128c, a material forming the target 128c is sputtered from the target 128c. The sputtered material is deposited on the object W3. As a consequence, a base film 16 is formed on a surface of the object W3, and an object W4 is obtained. As shown in FIG. 5B, the object W4 includes a base layer 10, an insulating film 12, a barrier film 14 and a base film 16. The base film 16 is a titanium nitride film, a tungsten film or a tungsten nitride film.

In one embodiment, a film thickness of the base film 16 is set such that the base film 16 becomes in an amorphous state. For example, in the step ST3, the base film 16 is formed to have a film thickness of greater than or equal to 1.0 nm and smaller than or equal to 2.5 nm.

Next, the step ST4 of the method MT is executed. In the step ST4, the object W4 is cooled to a temperature of 209 K or less. In one embodiment, after the execution of the step ST3, the object W4 is transferred from the processing module 110c to the processing module 110d through the transfer module 108. In the processing module 110d, the cooling of the object in the step ST4 is performed.

As shown in FIG. 6, the processing module 110d includes a chamber main body 120d, a stage 122d and a chiller 140d. The chamber main body 120d provides an inner space as a chamber Sd. The stage 122d is provided in the chamber Sd. An object is mounted on the stage 122d. The chiller 140d is coupled to the stage 122d. The chiller 140d is configured to cool the target object mounted on the stage 122d to a temperature of 209 K or less. The chiller 140d may be a freezer using, e.g., a Gifford-McMahon cycle (G.M. cycle). In the step ST4 of one embodiment, the object W4 mounted on the stage 122d is cooled to a temperature of 209 K or less by the chiller 140d.

Next, the step ST5 of the method MT is executed. In the step ST5, a copper film is formed on the base film 16 of the object W4 cooled in the step ST4. In one embodiment, after the execution of the step ST4, the object W4 is transferred from the processing module 110d to the processing module 110e through the transfer module 108. In the processing module 110e, the copper film formation in the step ST5 is performed.

As shown in FIG. 7A, the processing module 110e is the same sputtering apparatus as that constituting the processing module 110b. The processing module 110e includes a chamber main body 120e, a stage 122e, a target holder 126e, a power supply 130e, a gas supply unit 132e and a gas exhaust unit 134e. The chamber main body 120e provides a chamber Se. The stage 122e is provided in the chamber Se. The stage 122e is supported by a rotational shaft 124e and rotates about a central axis thereof by the rotation of the rotational shaft 124e by a driving unit. The target holder 126e holds the target 128e above the stage 122e. The target 128e is made of copper. The configurations of the power supply 130e, the gas supply unit 132e and the gas exhaust unit 134e are the same as those of the power supply 130b, the gas supply unit 132b and the gas exhaust unit 134b.

In the step ST5 of one embodiment, the object W4 cooled in the step ST4 is mounted on the stage 122e and held on the stage 122e. The stage 122e is rotated. A gas (rare gas such as Ar gas or the like or another inert gas) is supplied from the gas supply unit 132e into the chamber Se. The chamber Se is evacuated by the gas exhaust unit 134e. A voltage is applied from the power supply 130e to the target holder 126e. Accordingly, plasma is generated around the target 128e and ions in the plasma are attracted to the target 128e. When the ions collide with the target 128e, a material, i.e., copper, forming the target 128e is sputtered from the target 128e. The sputtered material is deposited on the object W4. Accordingly, a copper film 18 is formed on the base film 16 of the object W4, and an object W5 is obtained. As shown in FIG. 7B, the object W5 includes a base layer 10, an insulating film 14, a base film 16 and a copper film 18.

Next, the step ST6 of the method MT is executed. In the step ST6, the object W5 having a low temperature after the execution of the step ST5 is subjected to a temperature increase operation. The temperature of the object W5 may be increased by a heating unit. However, in one embodiment, the temperature of the object W5 is naturally increased. In other words, in the step ST6 of one embodiment, the temperature of the object W5 is increased under a normal temperature (e.g., room temperature) environment without using a heating unit. For example, the temperature of the object W5 is increased in the load-lock module 104 or 106.

The object having a general barrier film made of tantalum, tantalum nitride, cobalt or ruthenium is cooled to a low temperature and a copper film is formed on the barrier film. Even if the temperature of the copper film is increased, a particle size of a crystal in the copper film is not increased. In the method MT, the object W4 having the base film 16 that is a titanium nitride film, a tungsten film or a tungsten nitride film is cooled to a low temperature (209 K or less) in the step ST4 and the copper film 18 is formed on the base film 16. Although copper particles are agglomerated by surface diffusion on the object set to a relatively high temperature, the agglomeration of copper is suppressed on the base film 16 of the object W4 cooled to a low temperature. As a result, the copper film 18 formed in the step ST5 has a relatively small crystal particle before the temperature increase operation in the step ST6.

When the temperature of the copper film 18 formed on the base film 16 is increased, the particle size of the crystal in the copper film 18 is increased. According to a test performed by the present inventors, when a copper film was formed directly on the barrier film 14, the crystal in the copper film was oriented dominantly in the (111) orientation. On the other hand, when the temperature of the copper film 18 formed on the base film 16 was increased, the crystal in the copper film 18 was oriented in other orientations such as the (200) orientation, in addition to the (111) orientation. Therefore, in the method MT, the copper film 18 having a crystal having a large particle size is obtained. Accordingly, in the method MT, the copper film 18 having low resistance is formed.

While the embodiments have been described, various modifications may be made without being limited to the above-described embodiments. For example, the step ST2 of forming the barrier film 14 may be omitted. In other words, the base film 16 may be formed directly on the insulating film 12.

An object having the insulating film 12 on which the recess is formed has been described an example of the object to which the method MT is applied. In other words, an example in which the copper film 18 is formed to form copper wiring in the recess has been described. However, in the method MT, the base film 16 and the copper film 18 may be formed on the insulating film having a relatively flat surface. In that case, the copper wiring may be formed by etching the copper film 18 later.

Hereinafter, a test that has been executed to examine the method MT will be described. The present disclosure is not limited by the test to be described below.

(Evaluation of Dependence of Sheet Resistance of Copper Film on Film Thickness of Base Film)

Figure 8:
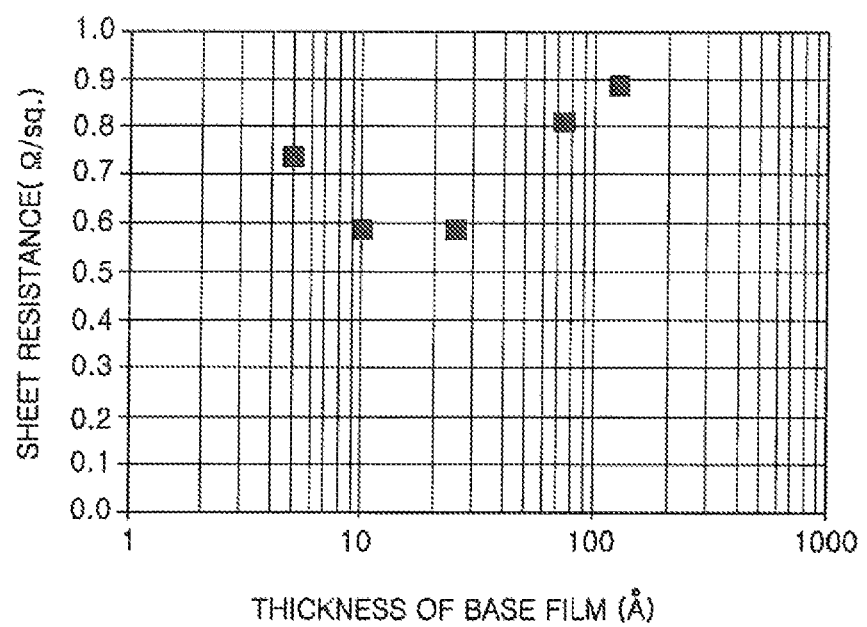
FIG. 8 is a graph showing an evaluation result of dependence of a sheet resistance of a copper on a film thickness of a base film.

In the test, a plurality of samples was obtained by forming the copper film 18 on base films 16 having different film thicknesses by performing the method MT. The film thickness of the copper film 18 was 50 nm. In the step ST4, the object was cooled to 100 K. In the step ST6, the temperature of the object after the formation of the copper film was increased under a normal temperature environment. Then, the sheet resistance of the copper film of each sample was measured. The result thereof is shown in FIG. 8. FIG. 8 is a graph showing an evaluation result of the dependence of the sheet resistance of the copper film on the film thickness of the base film. In FIG. 8, the horizontal axis represents the film thickness of the base film 16, and the vertical axis represents the sheet resistance of the copper film. As can be seen from FIG. 8, the sheet resistance of the copper film 18 which is obtained by the method MT was considerably low. Especially when the film thickness of the base film 16 was greater than or equal to 1.0 nm and smaller than or equal to 2.5 nm, the sheet resistance of the copper film 18 was even lower.

(Dependence of Surface Roughness and Sheet Resistance of Copper Film on Cooling Temperature in Step ST4)

Figure 9:
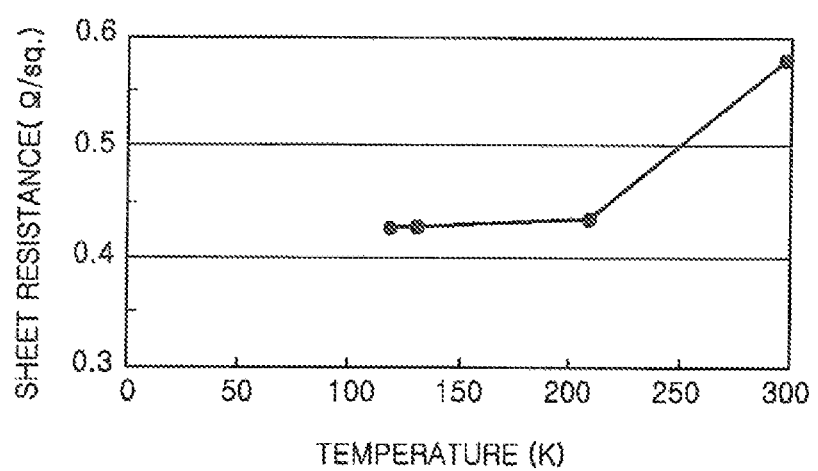
FIG. 9 is a graph showing an evaluation result of dependence of a sheet resistance of the copper film on a cooling temperature in the step ST4.
Figure 10:
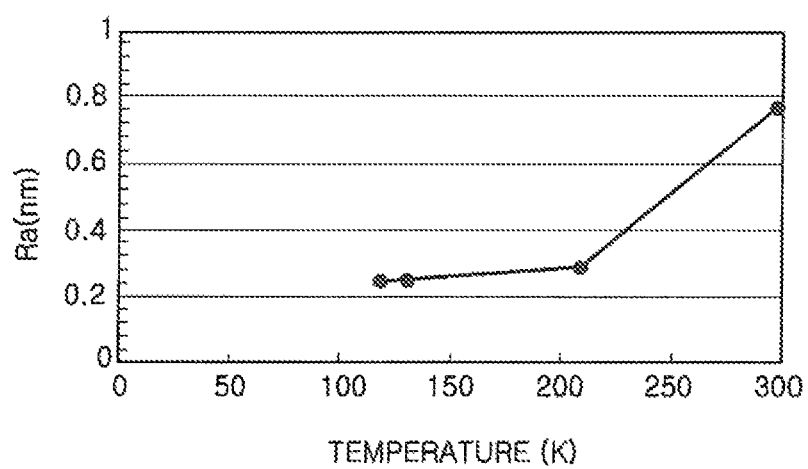
FIG. 10 is a graph showing an evaluation result of dependence of surface roughness of the copper film on the cooling temperature in the step ST4.

In a test, a plurality of samples was obtained by cooling an object having a silicon oxide film (step ST4), forming a copper film (film thickness: 50 nm) on the silicon oxide film of the cooled object (step ST5), and increasing a temperature of the object having the copper film under a normal temperature environment (step ST6). The samples were obtained by setting the temperature of the object to different levels in the step ST4. A particle size of a crystal of the copper film formed on the cooled silicon oxide film is increased when the temperature of the copper film on the silicon oxide film is increased, as in the case of the copper film formed on the cooled base film 16. In the test, sheet resistances and arithmetic mean roughnesses Ra of the copper films of the samples were measured. FIG. 9 is a graph showing an evaluation result of the dependence of the sheet resistance of the copper film on the cooling temperature in the step ST4. In FIG. 9, the horizontal axis represents the cooling temperature of the object in the step ST4, and the vertical axis represents the sheet resistance. FIG. 10 is a graph showing an evaluation result of the dependence of the surface roughness of the copper film on the cooling temperature in the ST4. In FIG. 10, the horizontal axis represents the cooling temperature of the object in the step ST4, and the vertical axis represents the arithmetic mean roughness Ra. As can be seen from FIG. 9, the sheet resistance of the copper film after the temperature increase operation in the step ST6 was decreased by cooling the object to a temperature of 209 K or less in the step ST4. As can be seen from FIG. 10, the surface roughness of the copper film after the temperature increase operation in the step ST6 was decreased by cooling the object to a temperature of 209 K or less in the step ST4. The particle size of the crystal in the copper film of each sample is about 500 nm, which is considerably larger than a particle size (about 50 nm) of a crystal in a general copper film.

While the disclosure has been shown and described with respect to the embodiments, it will be understood by those skilled in the art that various changes and modifications may be made without departing from the scope of the disclosure as defined in the following claims.

What is claimed is:

1. A method for forming a copper film, the method comprising:
    forming a base film along a surface of an insulating film of an object, the base film being one of a titanium nitride film, a tungsten film or a tungsten nitride film; and
    forming a copper film on the base film of the object having the insulating film and the base film after cooling the object to a temperature of 209 K or less.

2. The method of claim 1, wherein a film thickness of the base film is set such that the base film becomes in an amorphous state.

3. The method of claim 2, wherein the film thickness of the base film is set to be greater than or equal to 1.0 nm and smaller than or equal to 2.5 nm.

4. The method of claim 1, further comprising: increasing a temperature of the object including the insulating film, the base film and the copper film.

5. The method of claim 1, wherein a recess is formed on the insulating film and the base film is formed along a surface of the insulating film which defines the recess.

* * * * *